(12) United States Patent
Fang et al.

(10) Patent No.: US 7,983,081 B2
(45) Date of Patent: Jul. 19, 2011

(54) NON-VOLATILE MEMORY APPARATUS AND METHOD WITH DEEP N-WELL

(75) Inventors: Gang-Feng Fang, Fremont, CA (US); Wingyu Leung, Cupertino, CA (US)

(73) Assignee: Chip.Memory Technology, Inc., San Jose, CA (US)

( * ) Notice: Subject to any disclaimer, the term of this patent is extended or adjusted under 35 U.S.C. 154(b) by 215 days.

(21) Appl. No.: 12/334,510

(22) Filed: Dec. 14, 2008

(65) Prior Publication Data
US 2010/0149874 A1 Jun. 17, 2010

(51) Int. Cl.
 G11C 11/34 (2006.01)
 G11C 16/04 (2006.01)
 H01L 29/788 (2006.01)
(52) U.S. Cl. ......... 365/185.08; 365/185.1; 365/185.28; 365/185.29; 257/316; 257/321; 257/322
(58) Field of Classification Search .............. 365/185.08
See application file for complete search history.

(56) References Cited

U.S. PATENT DOCUMENTS

| | | | | |
|---|---|---|---|---|
| 5,465,231 A | * | 11/1995 | Ohsaki | 365/185.33 |
| 6,025,625 A | * | 2/2000 | Chi | 257/315 |
| 6,100,560 A | * | 8/2000 | Lovett | 257/315 |
| 6,512,700 B1 | * | 1/2003 | McPartland et al. | 365/185.28 |
| 6,808,169 B2 | * | 10/2004 | Hsu et al. | 257/315 |
| 6,842,327 B1 | * | 1/2005 | Diorio et al. | 361/301.4 |
| 7,099,192 B2 | * | 8/2006 | Wang et al. | 365/185.1 |
| 7,333,362 B2 | * | 2/2008 | Gendrier et al. | 365/185.01 |
| 7,382,658 B2 | * | 6/2008 | Fang et al. | 365/185.26 |
| 7,447,064 B1 | * | 11/2008 | Bu et al. | 365/185.01 |
| 7,542,342 B2 | * | 6/2009 | Kalnitsky et al. | 365/185.1 |
| 7,700,994 B2 | * | 4/2010 | Roizin et al. | 257/315 |
| 7,755,135 B2 | * | 7/2010 | Yoo et al. | 257/321 |

* cited by examiner

*Primary Examiner* — Son L Mai
(74) *Attorney, Agent, or Firm* — Raj Abhyanker P.C.

(57) ABSTRACT

An apparatus and method of an electrically programmable and erasable non-volatile memory cell with a deep N-well to isolate the memory cell from the substrate is disclosed. In one embodiment, a non-volatile memory apparatus includes at least one non-volatile memory cell fabricated on a P substrate, with a deep N-well located in the P substrate, while a P-well and an N-well are located in the deep N-well. The memory cell further includes a PMOS transistor located in the N-well, in which the PMOS transistor includes a PMOS gate-oxide, and an NMOS capacitor located in the P-well. The NMOS capacitor includes an N+ coupling region located in the P-well, and an NMOS gate-oxide. The memory cell further includes a floating gate comprised of a poly-silicon gate overlying the PMOS transistor and the NMOS capacitor.

20 Claims, 12 Drawing Sheets

|  | WL | BL | COM | DNW/NW |
|---|---|---|---|---|
| PROGRAM MODE (PROGRAM CELL 200) |  |  |  |  |
| CELL 200 | 2V | 2.5V | -2V | 3.3V |
| CELL 210 | 2V | 1.2V | 1.2V | 3.3V |
| CELL 220 | 3.3V | 2.5V | -2V | 3.3V |
| CELL 230 | 3.3V | 1.2V | 1.2V | 3.3V |
| ERASE MODE (ERASE CELL 200, 210) |  |  |  |  |
| CELL 200 | -5V | 5V | 5V | 5V |
| CELL 210 | -5V | 0V | 0V | 5V |
| CELL 220 | 0V | 5V | 5V | 5V |
| CELL 230 | 0V | 0V | 0V | 5V |
| READ MODE (READ CELLS 200, 210) |  |  |  |  |
| CELLS 200, 210 | 0V | 0V | 1.2V | 1.5V |
| CELLS 220, 230 | 1.5V | 0V | 1.2V | 1.5V |

FIGURE 5

|  | WL | BL | CG | COM | DNW/NW |
|---|---|---|---|---|---|
| PROGRAM MODE (PROGRAM CELL 400) |  |  |  |  |  |
| CELL 400 | 0V | 2.5V | 2V | -2V | 2.5V |
| CELL 410 | 0V | 1.2V | 2V | 1.2V | 2.5V |
| CELL 420 | 2.5V | 2.5V | 0V | -2V | 2.5V |
| CELL 430 | 2.5V | 1.2V | 0V | 1.2V | 2.5V |
| ERASE MODE (ERASE CELL 400) |  |  |  |  |  |
| CELL 400 | 5V | 3.3V | -5V | 5V | 5V |
| CELL 410 | 5V | 3.3V | -5V | 0V | 5V |
| CELL 420 | 5V | 3.3V | 0V | 5V | 5V |
| CELL 430 | 5V | 3.3V | 0V | 0V | 5V |
| READ MODE (READ CELLS 400, 410) |  |  |  |  |  |
| CELLS 400, 410 | 0V | 0V | 0V | 1.2V | 1.5V |
| CELLS 420, 430 | 1.5V | 0V | 0V | 1.2V | 1.5V |

NON-VOLATILE MEMORY APPARATUS AND METHOD WITH DEEP N-WELL

FIELD OF TECHNOLOGY

This disclosure relates generally to non-volatile memory. More particularly, this invention relates to an apparatus and method of an electrically programmable and erasable non-volatile memory cell with a deep N-well to isolate the memory cell from the substrate.

BACKGROUND

As semi-conductor processes continue to scale, the number of transistors available in a silicon-chip increases. Integrating the whole system on a chip becomes a possibility for many applications. However, multiple systems are composed of many separate components such as DRAM, EEPROM, and FLASH which are fabricated using specialized processes. These processes may not be compatible with the common logic process used for manufacturing logic components such as micro-processors and system logics.

Common logic or application-specific-integrated-circuit (ASIC) processes are typically the most aggressively scaled processes offered by silicon foundries. In order to integrate specialized memory components (e.g., EEPROM, DRAM and FLASH) on the same substrate as logic components, additional processing steps may need to be added to a logic process. However, adding steps to logic manufacturing processes adds to the manufacturing cost of all the components of the chip, including the logic components.

Alternatively, memory circuits may need to be designed to be compatible with the logic process. Designing memory circuits to be compatible with logic processes are therefore more desirable, especially for chips in which logic circuits occupy the majority of the chip area.

The common logic processes offered by silicon foundries with feature sizes in a very deep submicron (e.g., 130 nm and 90 nm) area may include the following characteristics: 1) single-layer poly-silicon; 2) transistors with thin oxide for the logic circuits operating at a lower supply voltage (e.g., 1.0 v) and transistors with thick oxide for handling higher 10 voltages (for example 3.3 v); 3) Deep N-well for the isolation of the n-channel transistors used in noise sensitive circuits such as clock synchronizers.

Although prior art methods have attempted to build non-volatile memories (e.g. EEPROM, FLASH) using logic processes, each include limitations that may result in a need for special circuits, a larger cell size, compromised data retention, added power costs, and/or added manufacturing complexity.

For example, a memory cell may include a PMOS transistor and an NMOS coupling capacitor, the bulk of which is connected to a substrate that is common with a logic circuit. The substrate of the memory cell is in multiple cases connected to ground or 0 v. In this configuration, the memory may require a relatively high voltage (e.g., 6.5 v or higher) connected to the source or drain of the PMOS transistor. Without high-voltage transistors, a special circuit technique may be required to build on-chip programming circuits that are capable of tolerating the relatively high voltage used for programming the memory cell. In addition, to facilitate Fowler-Nordheim tunneling at the relatively high voltage, the oxide thickness of the transistors may be limited, making data retention less reliable. This memory cell may therefore also require special circuits to enhance data retention time.

Additional variants of memory cells exist, each of which may include various limitations. For example, a type of single-poly EPROM memory cell may not be erased electrically. An additional type of memory cell may require two NMOS transistors, and may require hot-hole injection into the floating gate and hot-electron injection into the floating gate. In another type of memory cell, a spacer nitride next to a poly gate may be required to trap hot carriers generated during a programming and an erase operation of the memory cell.

An additional type of memory cell may require the use of three transistors and a shared floating gate to form an access device, a program device, and a coupling capacitor of a memory cell. An additional type of memory cell may require four MOS devices. An alternate memory cell may require that a coupling device operate with a capacitance smaller than the gate capacitance of an access device of the memory cell. Another type of FLASH memory cell may require being formed with a N+ region under a floating gate where the N+ region is continuous with a diffusion word line. The N+ region may require an additional implant that cannot be formed as part of the logic process.

An additional type of memory cell may require the use of a coupling capacitor with two charge injection regions. The memory cell may also be deposed directly on the substrate, which may restrict the source and drain voltage from being set more positive than the logic supply voltage or more negative than ground. This may severely limit cells that are constrained to critical dimensions of 130 nm or smaller. Yet another type of memory cell may require the use of a PMOS transistor and a PMOS coupling capacitor. It would therefore be desirable to have a non-volatile memory cell that avoids the limitations of the prior art.

SUMMARY

The present invention provides an apparatus and method of an electrically programmable and erasable non-volatile memory cell with a deep N-well to isolate the memory cell from the substrate is disclosed. Accordingly, the memory cell may be fabricated using processes that are commonly available in silicon foundries with deep sub-micron technologies with feature sizes equal to 0.13 um or smaller.

The process provides transistors with two gate-oxide thicknesses, a thin oxide and a thick oxide. The thin gate-oxide has a thickness 2 nm or thinner, and it may be used for most on-chip circuits that can be powered by a power supply of 1.3 v or lower. The thicker gate-oxide has a thickness of 50 nm for 2.5 v circuits and 7 nm for 3.3 v circuits. These higher voltage circuits are mainly used in the chip input-output circuits to comply with certain chip-to-chip interface standards, such as LVTTL. The present embodiments of the memory cells use the thick oxide devices to cause data retention to last approximately 10 years or longer.

In one embodiment, the non-volatile memory cell includes a P substrate, a deep N-well disposed in the P substrate, a P-well disposed in the deep N-well, an N-well also disposed in the deep N-well, a PMOS transistor fabricated in the N-well, and a NMOS capacitor fabricated in the P-well. The PMOS transistor includes a gate-oxide and an overlying poly-silicon gate. The NMOS capacitor includes an N+ coupling region located in the P-well, a gate-oxide and an overlying poly-silicon gate. The N+ coupling region is formed by the N+ source/drain implants. The poly-silicon gate of the NMOS capacitor extends and merges with the PMOS gate forming the floating gate of the memory cell. The N+ coupling region couples a control word line (CWL) to the control gate of the memory cell. The control gate is formed by the channel region of the NMOS capacitor. The coupling capacitor structure thus consists of the floating gate overlapping the active region in the P-well, the underlying gate-oxide and the NMOS channel. To increase the effectiveness of the coupling gate, the coupling capacitance is made substantially larger than the PMOS gate capacitance.

The memory cell is programmed by hot channel electron tunneling to the floating gate. Erase is performed using Fowler-Nordheim tunneling of the electrons from the floating gate to the channel of the PMOS transistor. The tunneling oxide for both program and erase operation is the gate-oxide over the PMOS channel region.

In another embodiment, the cell includes a P substrate, a deep N-well disposed in the P substrate, a P-well disposed in the deep N-well, an N-well also disposed in the deep N-well and next to the P-well, a first PMOS transistor fabricated in the N-well with a P+ source and drain separated by the P-channel, a second PMOS transistor fabricated in the same N-well, and an NMOS capacitor fabricated in the P-well.

The first PMOS transistor includes a gate-oxide and an overlying poly-silicon gate. The gate-oxide of the first PMOS transistor overlying the channel area forms the tunnel oxide where electrons tunnel from the floating gate to the channel during an erase operation, and where electrons tunnel from the channel to the gate during a program operation.

The NMOS capacitor includes an N+ coupling region located in the P-well, a gate-oxide and an overlying poly-silicon gate. The N+ coupling region is formed by the N+ source/drain implants. The poly-silicon gate of the NMOS capacitor extends and merges with the first PMOS gate forming the floating gate of the memory cell. The N+ coupling region couples a control-gate signal (CG) to the control gate of the memory cell. The control gate is formed by the channel region of the NMOS capacitor.

The coupling capacitor structure thus consists of the floating gate overlapping the active region in the P-well, the underlying gate-oxide and the NMOS channel. To increase the effectiveness of the coupling gate, the coupling capacitance is made substantially larger than the PMOS gate capacitance. The second PMOS is fabricated next to the first PMOS transistor, and the two PMOS transistors have one of their source and drain connected together. The second PMOS transistor also includes a gate-oxide and an overlying poly-silicon gate, which is coupled to an access word line (WL) signal. The memory cell is programmed by channel hot-electron tunneling from the channel of the first PMOS transistor to the floating gate, and erased by Fowler Nordheim tunneling of electrons from the floating gate to the channel of the first PMOS transistor.

The first embodiment of the memory cell uses only two devices, and it therefore is smaller than the second embodiment, which uses three devices. The second embodiment uses a second PMOS transistor to isolate the programmable first PMOS transistor to minimize a program disturbance problem.

BRIEF DESCRIPTION OF THE DRAWINGS

Example embodiments are illustrated by way of example and not limitation in the figures of the accompanying drawings, in which like references indicate similar elements and in which:

FIG. 5 illustrates the biasing voltages of the signals connecting to the memory array during different operations, according to one embodiment.

FIG. 11 illustrates the biasing voltages of the signals connecting to the memory array during different operations, according to one embodiment.

Other features of the present embodiments will be apparent from the accompanying drawings and from the detailed description that follows.

DETAILED DESCRIPTION

An apparatus and method of an electrically programmable and erasable non-volatile memory cell with a deep N-well to isolate the memory cell from the substrate is disclosed. Although the present embodiments have been described with reference to specific example embodiments, it will be evident that various modifications and changes may be made to these embodiments without departing from the broader spirit and scope of the various embodiments. Furthermore, although specific voltages are provided in example embodiments and figures, it is understood that the numbers need not be exact and are used to convey the general concept of the biasing schemes.

Figure 1:
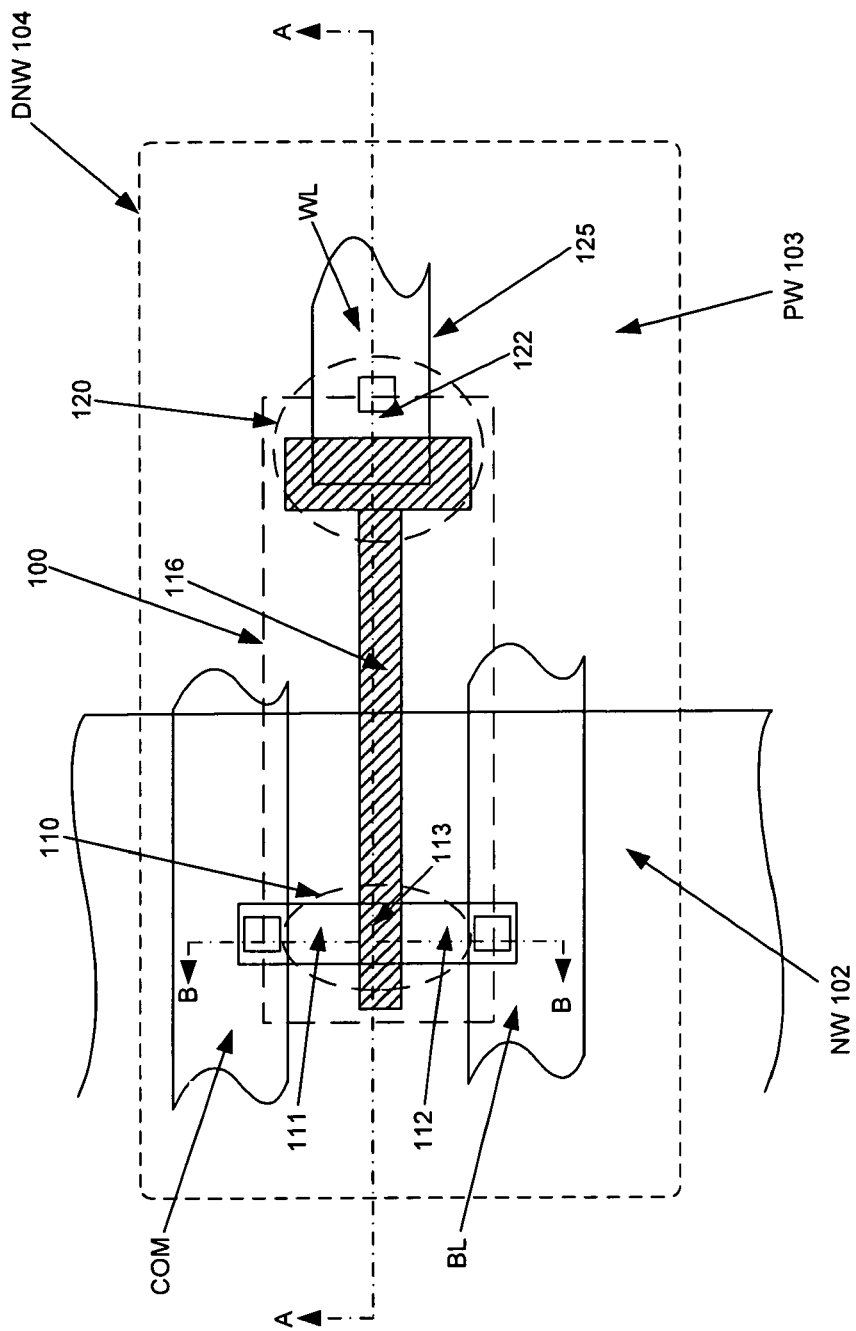
FIG. 1 illustrates the top layout view of the non-volatile memory cell, according to one embodiment.
Figure 2:
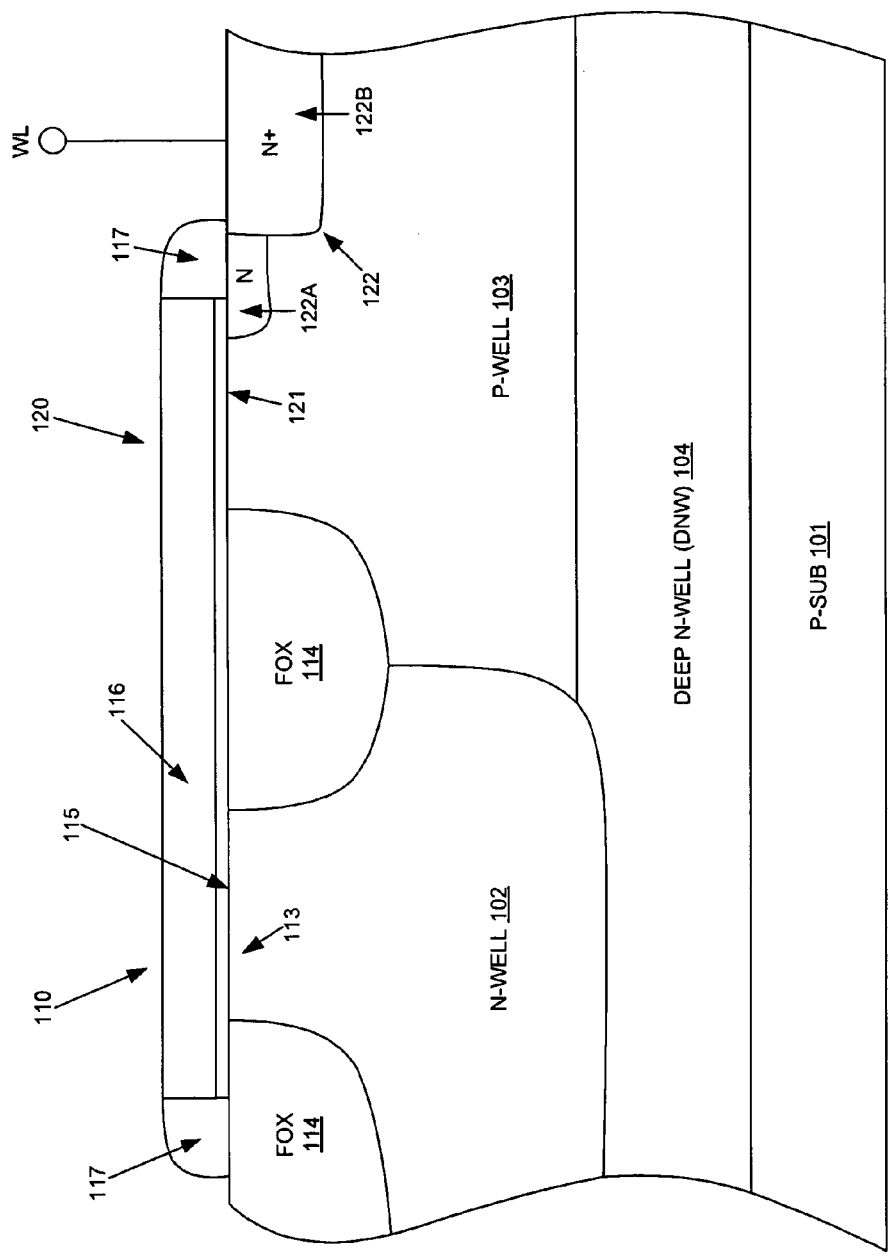
FIG. 2 illustrates a cross section view of the memory cell of FIG. 1 along section line A-A, according to an embodiment.
Figure 3:
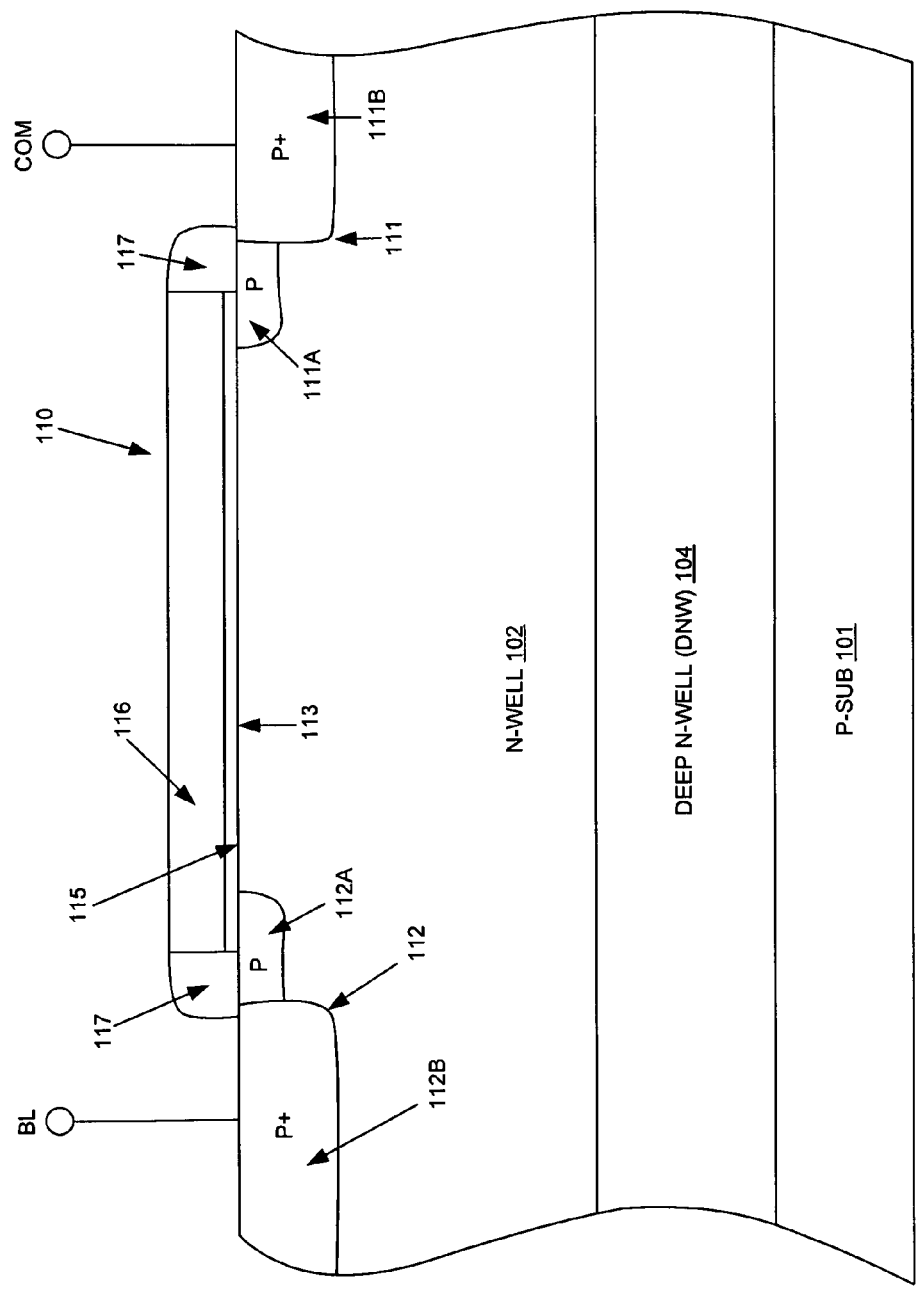
FIG. 3 illustrates a cross section view of the memory cell of FIG. 1 along section line B-B, according to an embodiment.

According to one embodiment of the present invention, a one-transistor-one-capacitor cell capable of adding, removing, and storing charge in a floating gate is provided. FIG. 1 shows the top layout view of the non-volatile cell 100, according to one embodiment. FIG. 2 is a cross section view of the cell along section line A-A, according to one embodiment. FIG. 3 shows the cross section view of the cell along line B-B, according to one embodiment.

In the present embodiment, the cell is fabricated using a 130 nm logic process. The process may provide transistors with two gate-oxide thicknesses of 2.2 nm and 7 nm. The thin-gate transistors are used primarily for logic circuits which have a supply voltage of approximately 1.2 v. The thick-gate transistors are used for circuits with a nominal supply voltage of 3.3 v.

In the present embodiment, a non-volatile memory cell 100 is fabricated in a p-type silicon substrate 101. A deep N-well 104 is disposed in P substrate 101, electrically isolating the memory cell devices from the substrate. An N-well 102 and a P-well 103 are disposed next to each other in deep N-well 104. A PMOS read-out transistor 110 is disposed in N-well 102. PMOS transistor 110 includes p-type source region 112 and drain region 111. Source region 112 includes lightly doped source 112A and P+ contact region 112B. Drain region 111 includes lightly doped region 111A and highly doped contact region 111B.

Source 111 is connected to a common (COM) line and drain 112 is connected to a bit line (BL). Transistor 110 is surrounded by a shallow trench filled with thick field oxide 114. Between source 111 and drain 112 is the channel region 113. A gate-oxide layer 115 overlying channel 113 has an oxide thickness of 7 nm. A conductively doped poly-silicon gate is disposed on top of gate-oxide 115 forming a floating gate 116 of the PMOS transistor.

Floating gate 116 and thin oxide 115 extend to P-well 103 and overlap active region 125, forming the top plate and the dielectric of NMOS capacitor 120. Floating gate 116 also overlaps part of charge injector 122 which consists of a lightly doped N region 122A and N+ region 122B. Floating gate 116 is surrounded by side-wall spacer 117 which is typically formed using silicon nitride or oxide.

During the formation of the N+ or P+ regions, spacer 117 stops the P+ or N+ implant from getting into the lightly doped P or N regions. Charge injector 122 connects to a word line (WL) which also connects to the P-well through a P+ contact (not shown). During operation, when the floating gate 116 has a potential higher than WL by a voltage larger than the threshold voltage of the NMOS capacitor, P-well region 121 under the floating gate is inverted. A layer of electrons injected by injector 122 forms in region 121, thereby forming the bottom plate of NMOS capacitor 120. Bottom plate 121 is coupled to WL through injector 122.

All the processing steps required to form memory cell 100 are used to form other on-chip circuits in a logic process. No extra processing step is required. The gate capacitance of NMOS capacitor 120 is approximately 2.5 times the gate capacitance of PMOS transistor 110 according to one embodiment.

Figure 4:
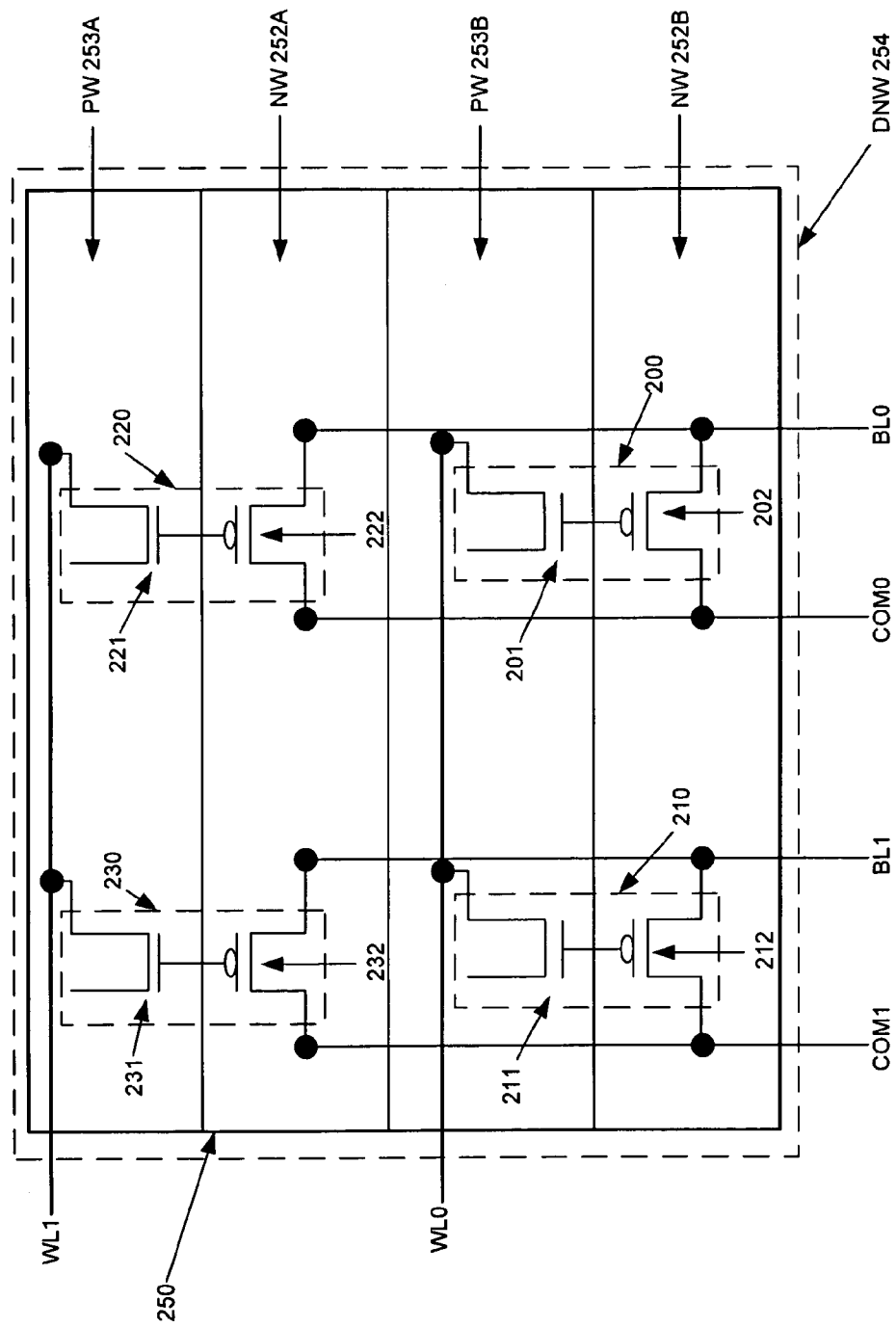
FIG. 4 illustrates the non-volatile memory cell included as part of a two by two memory array, according to one embodiment.

In most applications, multiple non-volatile cells 100 may be put together to form a memory array. For illustration purposes, the operation of a two by two memory array 250 is described and illustrated in FIG. 4. The array contains four memory cells arranged into two rows and two columns. By increasing and/or decreasing the number of rows and/or columns, arrays of different sizes can be formed. The memory array 250 includes memory cells 200, 210, 220, and 230. Memory array 250 also includes NMOS capacitors 201, 211, 221, and 231 and PMOS transistors 202, 212, 222, and 232.

In the embodiment, WL of memory cells 200 and 210 are connected to WL0 to form a row of memory, and WL of memory cells 220 and 230 are connected to WL1 to form another row of memory. The common (COM) and bit line (BL) of cells 200 and 220 are connected to COM0 and BL0 respectively to form a memory column. Similarly, COM and BL of cells 210 and 230 are connected to COM1 and BL1 respectively to form another memory column. The memory array is fabricated in a p-type substrate. The deep N-wells of the memory cells are merged together to form a single deep N-well (e.g., DNW 254). The P-well and N-well of the memory cells in a memory row are respectively merged together. Thus each memory row contains one N-well (e.g., NW 252A, NW 252B), and one P-well (e.g., PW 253A, PW 253B).

Each N-well is connected to the deep N-well, which in turn connects to signal DNW. The P-well of memory row "m" is connected to the word line WLm, where "m" designates the row number. By merging the wells in a row together, memory cells in an array can be more tightly packed as most of the well-to-well spaces are eliminated. The memory array is fabricated in the same substrate as other on-chip logic circuits, which may require the substrate to be connected to ground or 0 v.

FIG. 5 shows the biasing voltages of the signals connecting to the memory array during different operations, according to one embodiment. Each of memory cells in array 250 may be independently erased or programmed. Consequently, memory array 250 can be used to form a large electrically erasable programmable memory (EEPROM), which is different from a FLASH memory, in which all the cells in a page are erased together. Alternatively, the memory array 250 may be used to form a FLASH memory by erasing or programming the cells in array 250 together.

A memory cell may be designated for programming, according to one embodiment. During programming, electrons are added to the floating gate of the selected cell, causing the threshold voltage of the read-out transistor to decrease, making it easier to turn on, and causing the readout current to increase during read operations. For example, memory cell 200 may be programmed by driving WL0 to 2 v; BL0 to 2.5 v; and COM0 to −2 v.

In the readout transistor, with 4.5 v across the source and the drain of the PMOS transistor, the lateral field from source to drain is substantially stronger than the vertical field from source to floating-gate. Consequently, holes accelerate across the channel (e.g., the channel 113 of FIG. 3) causing impact ionization to occur at the drain depletion region. Hot electrons generated by impact ionization are attracted by the positively biased control gate and injected into the floating gate. The negative drain bias (−2.5 v) attracts most of the hot holes and allows few hot holes to tunnel to the floating gate. Consequently, the number of electrons in the floating gate increases during programming.

Memory cell 210 also receives a word line voltage of 2 v, but its read out transistor is not turned on because its drain and source, which are connected to BL1 and COM1 respectively, are driven to 1.2 v. Therefore, the threshold voltage of the readout transistor 212 in cell 210 is not affected. With WL1 driven to 3.3 v, the read-out transistors in cell 220 and 230 are both turned off, and holes generated in the channel region of the readout transistor are minimized. Consequently, the amount of hot electrons generated by impact ionization is small, and programming disturbance on these cells is minimized. Programming disturbance in cell 230 is less than in cell 220 because, with source and drain voltage in the readout transistor 232 of cell 230 being approximately equal, the lateral field is approximately zero. During programming, DNW is driven to 3.3 v to ensure that all the junctions in the array 250 are reversely biased.

In another operation, a memory cell may be designated for erase. During the erase operation, electrons are removed from the floating gate of the selected cell, causing the threshold voltage of the read-out transistor to increase, making it more difficult to turn on, and causing its readout current during read operations to decrease.

For example, memory cell 200 is erased by driving WL0 to −5 v; both BL0 and COM0 to 5 v. Under this bias condition, an inversion layer is formed in the bottom plate of the NMOS capacitor 201, and the floating gate is coupled to approximately −3.5 v. With the source and drain of the readout transistor driven to 5 v, an inversion layer is also formed in the channel region of the PMOS transistor 202. The inverted channel is connected to the source and drain, and receives a potential voltage of 5 v. Thus, a total voltage of approximately 8.5 v is imposed on the gate-oxide of the PMOS transistor 202 creating a high field sufficient to cause electrons trapped in the floating gate to tunnel to the inverted channel, which is full of positive carriers. The high field may exceed approximately 10 MeV, and the tunneling mechanism is direct tunneling and/or Fowler-Nordheim tunneling.

In the present embodiment, WL0 and thus the P-well 253B that cells 200 and 210 share can be driven to a potential more negative than the substrate bias (0 v) because the P-well 253B is isolated from the substrate by the deep N-well 254. The deep N-well 254 is driven to 5 v during erase.

Memory cell 210 also receives a word line voltage of −5 v but the source and drain of its readout transistor 212 receive a bias of 0 v. As a result, the voltage across the gate-oxide is only 3.5 v, and the resulting field is not sufficient to trigger Fowler-Nordheim tunneling even though inversion layers are formed both in the channel of the readout transistor 212 and the NMOS capacitor 211. Thus, memory cell 210 is not affected during erase.

In memory cell 220, the source and drain of the readout transistor 222 is driven to 5 v, but the word line connecting to WL1 receives a bias of 0 v. As a result, the voltage across the gate-oxide of the readout transistor 222 is only 3.5 v, which is not enough to cause Fowler-Nordheim tunneling even though inversion layers are formed both in the channel of the readout transistor 222 and the NMOS capacitor 221. Thus memory cell 220 is not affected during erase.

In memory cell 230, both the word line and the source and drain of the readout transistor 232 are biased to 0 v. The field across the gate-oxide of the readout transistor 232 is thus negligible and the cell is not affected during erase.

In a read operation, the data in a row of memory cells can be read simultaneously. The PMOS readout transistors in a programmed and erased cell have a threshold voltage of approximately 0 v and −1.5 v, respectively. In one embodiment, memory cells in row 0 are selected for the read operation, and cell 200 is in the programmed state, but cell 210 is in an erased state. Accordingly, all the common lines (COM) are driven to 1.2 v, all the bit lines (BL) are pre-charged to 0 v, and the N-well and the DNW are driven to 1.5 v. The unselected word line is driven to 1.5 v but the selected word line, WL0, is driven to 0 v.

As a result, the readout transistor 202 in cell 200 is turned on, pulling BL0 to 1.2 v, but the readout transistor 212 in cell 210 stays off, leaving BL1 at 0 v because the threshold voltage of the readout transistor 212 is more negative than the floating gate bias voltage. The high voltage in BL0 is subsequently sensed by a sense amplifier and driven to a data output signal with a state of "1." Likewise, the low state in BL1 is sensed by another amplifier and driven to another output signal with a state of "0." Note that readout transistors in cells with unselected rows are turned off regardless of their program or erase state because of their high word line voltage. Therefore, they have no effect on the bit lines.

Figure 6:
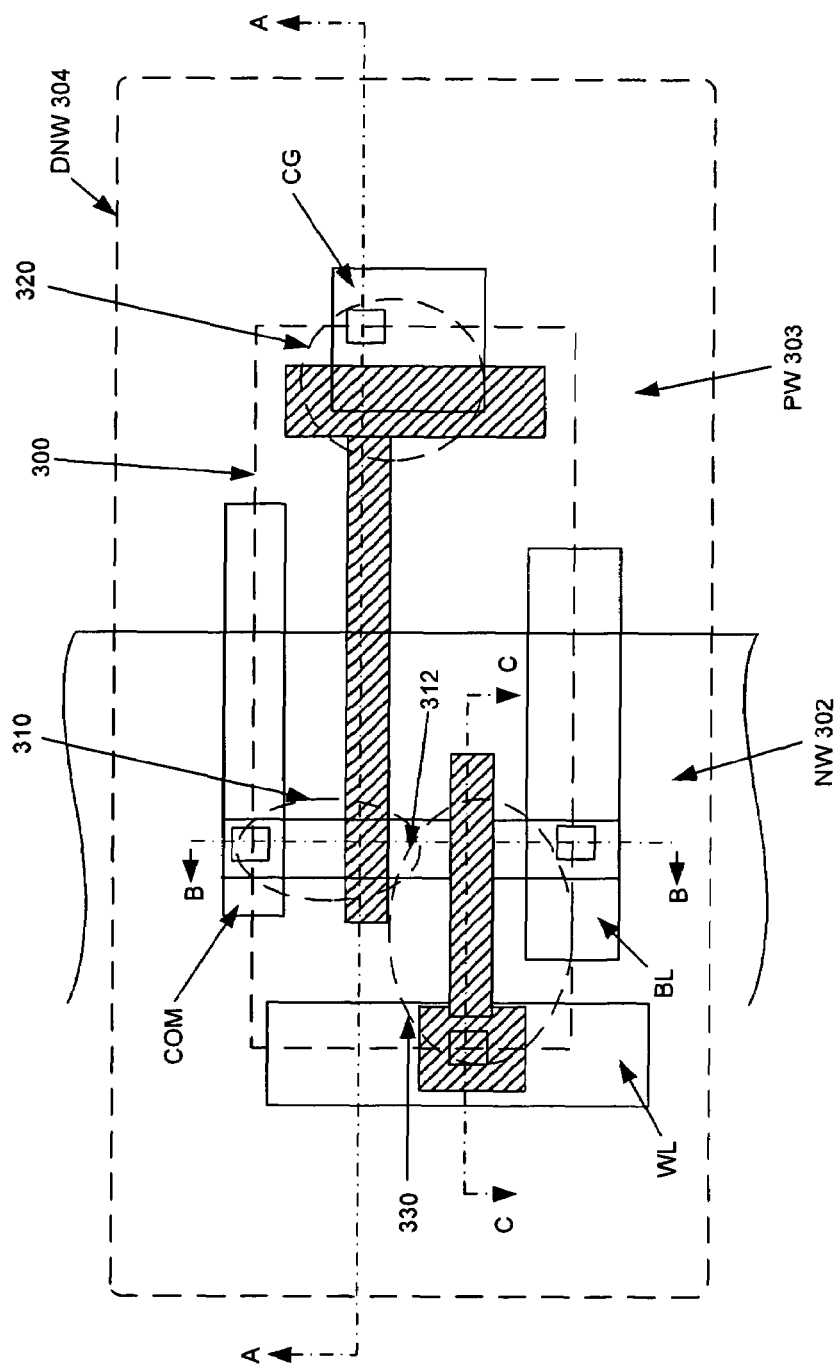
FIG. 6 shows the top layout view of the non-volatile memory cell in an additional embodiment.
Figure 7:
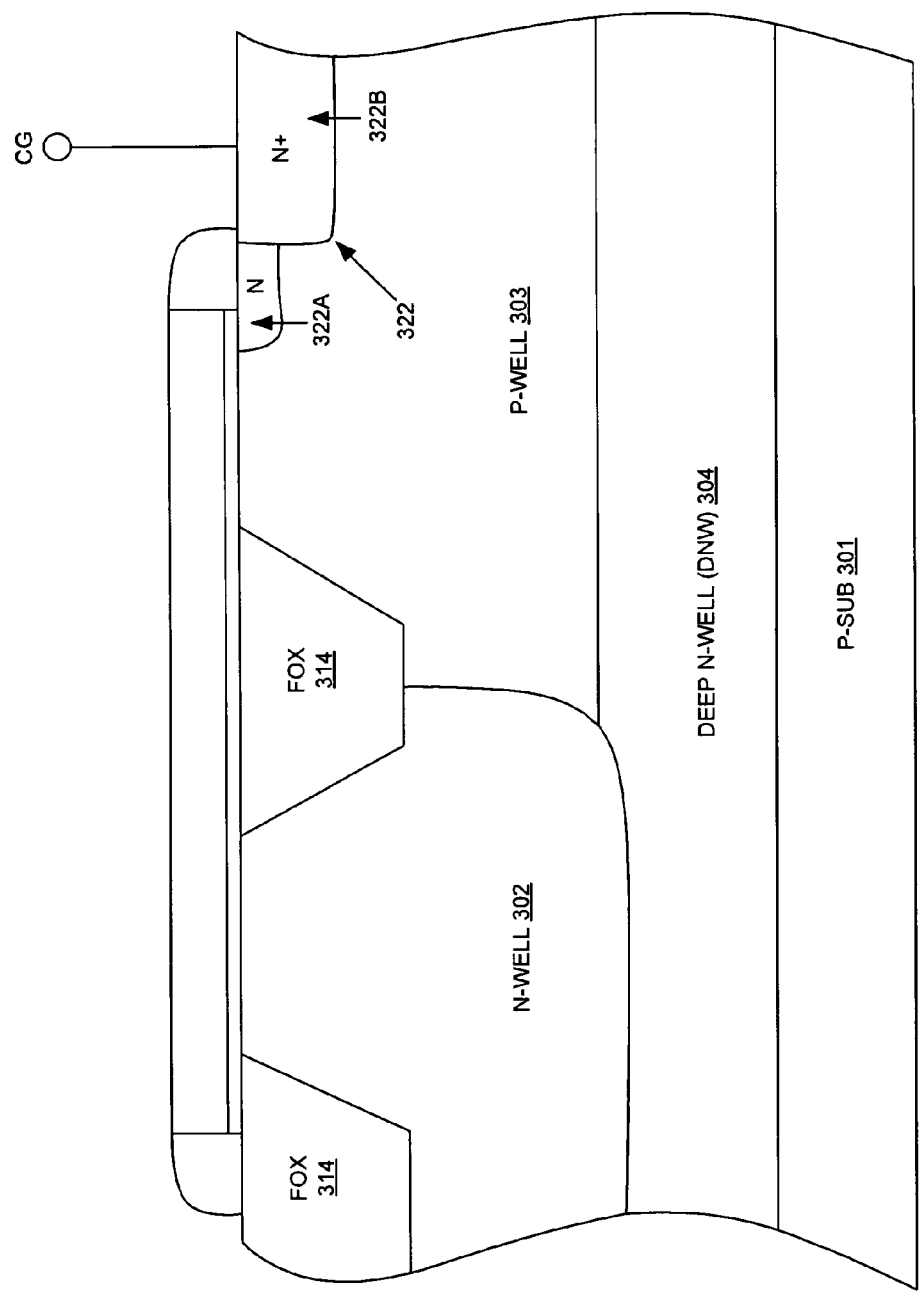
FIG. 7 illustrates the cross section of the memory cell of FIG. 6 along section line A-A, according to one embodiment.
Figure 8:
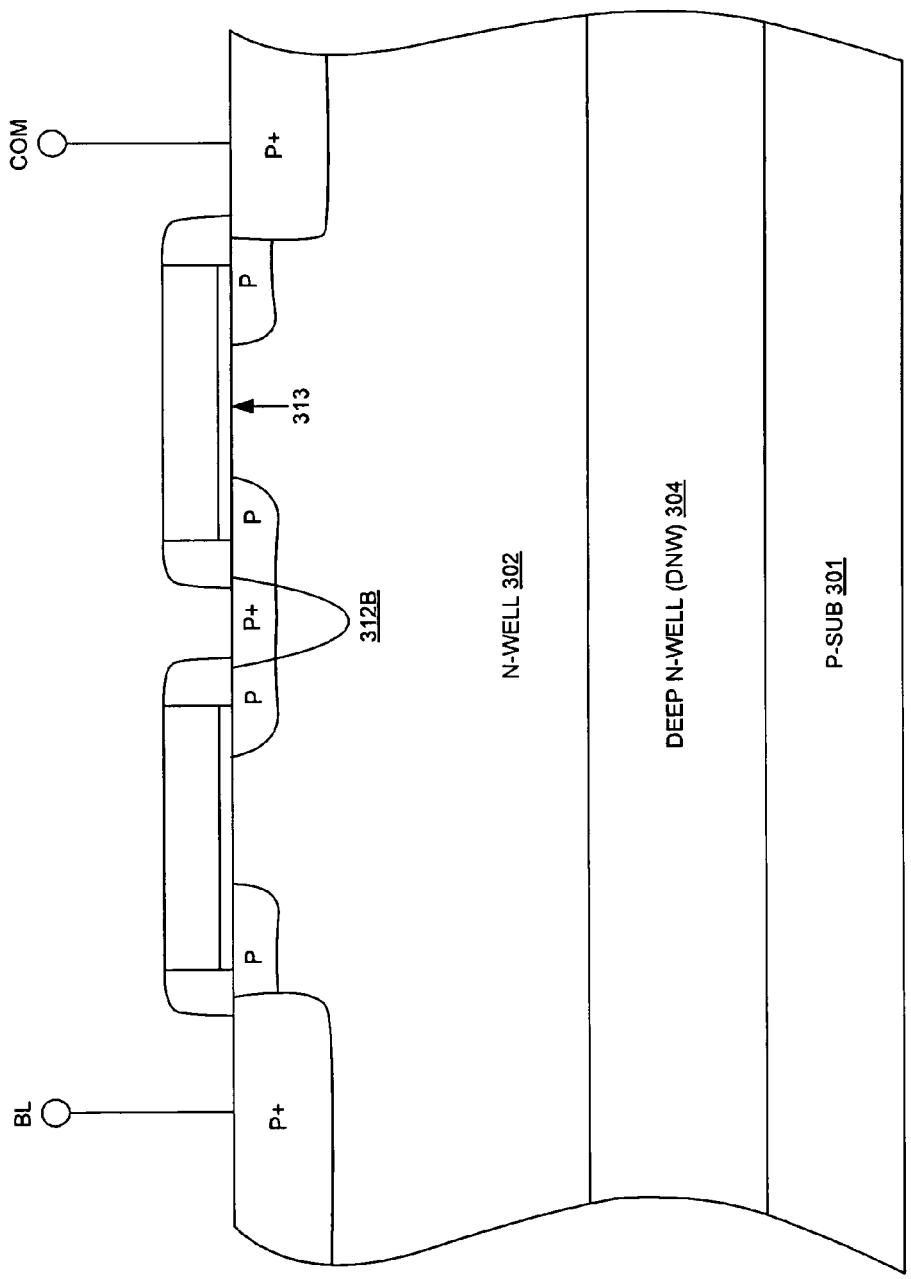
FIG. 8 illustrates the cross section of the memory cell of FIG. 6 along section line B-B, according to one embodiment.
Figure 9:
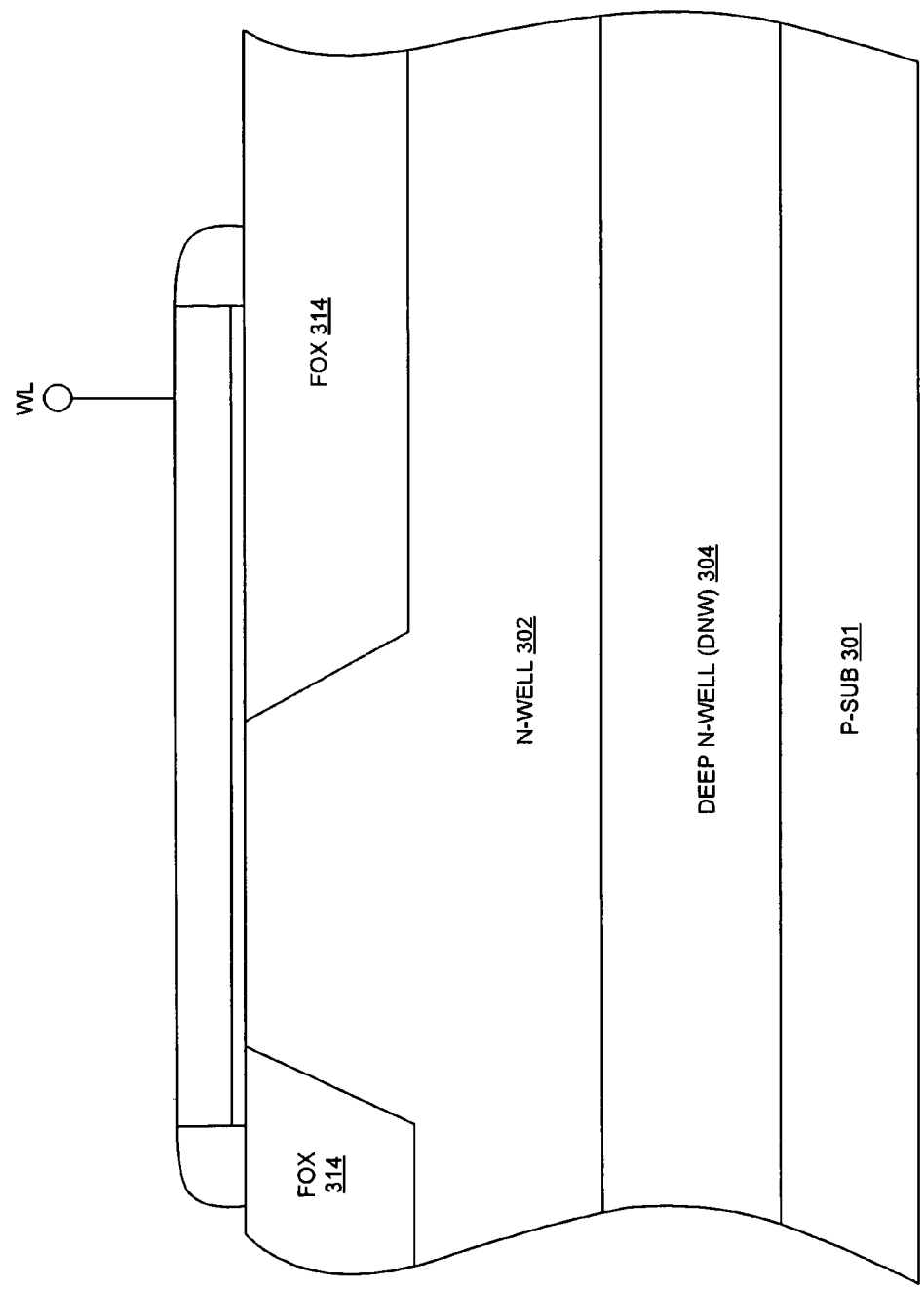
FIG. 9 illustrates the cross section of the memory cell of FIG. 6 along section line C-C, according to one embodiment.

In an additional embodiment, an access PMOS transistor 330 is added in series with the readout transistor 310 to the non-volatile memory cell 100 of FIG. 1. FIG. 6 shows the top layout view of the non-volatile cell 300 with PMOS transistor 330. The cross sections along section lines A-A, B-B, and C-C of FIG. 6 are shown in FIG. 7, FIG. 8, and FIG. 9 respectively, according to various embodiments.

The non-volatile cell 300 consists of NMOS coupling capacitor 320, readout PMOS transistor 310 and access PMOS transistor 330. PMOS transistor 310 includes p-type source region 312, which includes lightly doped source 312A and P+ contact region 312B. The P+ region 312B of the drain of readout transistor 310 is shared with the P+ region of the source of access transistor 330. The two PMOS transistors are thus connected in series. In addition, cell 300 includes thick field oxide 314. Channel region 313 is located between the source and drain of transistor 310.

The bit line (BL) is connected to the drain of access transistor 330. Charge injector 322 of the NMOS coupling capacitor 320 is coupled to a control-gate signal CG which is used to control the voltage of the floating gate during memory operations. Charge injector 122 includes lightly doped N region 322A and N+ region 322B. The gate of the access transistor 330 is connected to the word line (WL). By controlling the access gate voltage through WL, the access transistor 330 can be turned on or off, thereby coupling or decoupling the readout transistor to/from bit line BL. The source of the readout transistor 310, as in memory cell 100, is connected to the common signal (COM). Similar to the memory cell 100, the NMOS coupling capacitor 320 is disposed in P-well 303, the PMOS transistors 310 and 330 are disposed in N-well 302 adjacent to the P-well. Both of the wells are disposed in a deep N-well (DNW) 304 which is disposed in a P-substrate 301.

Figure 10:
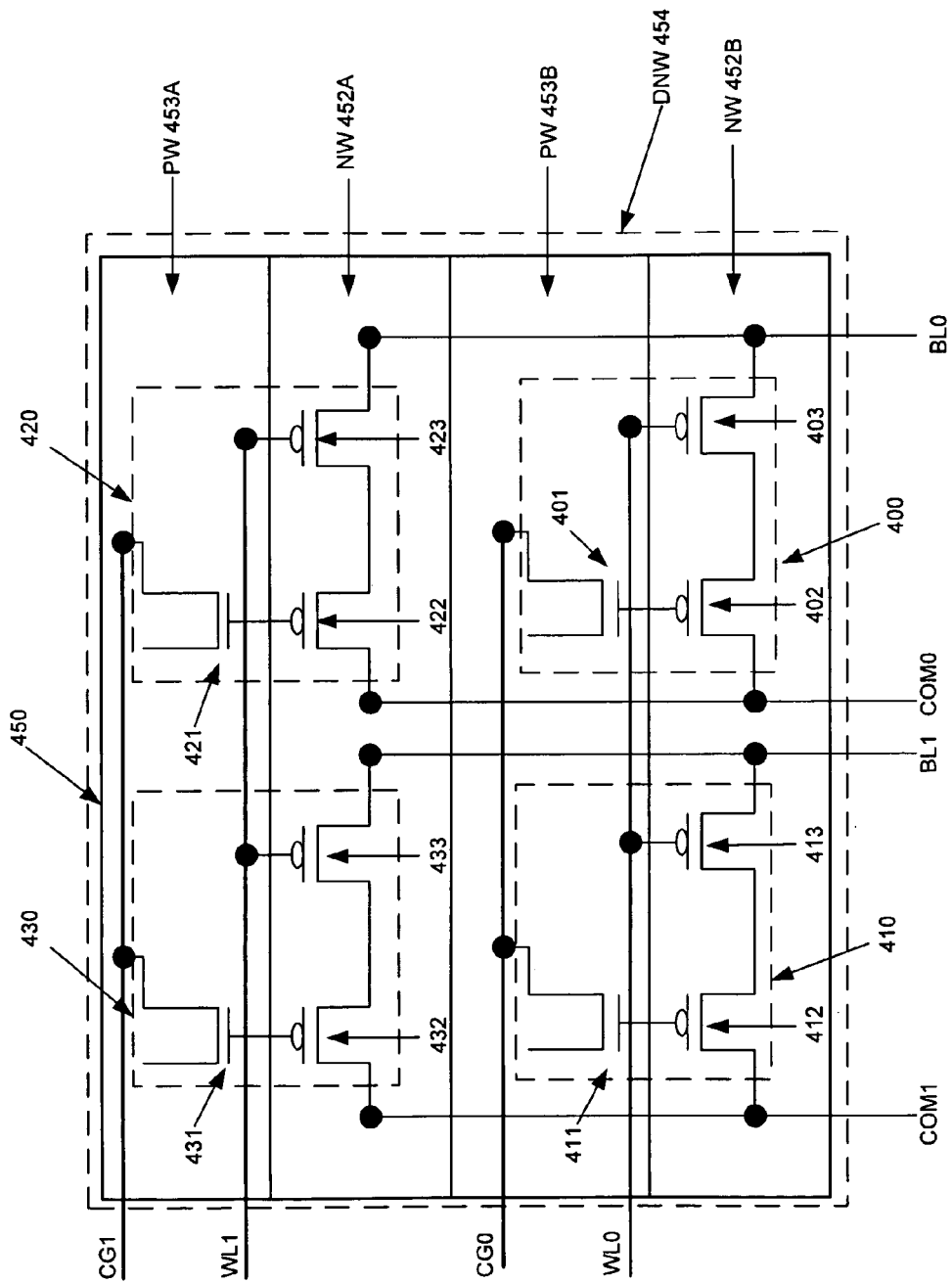
FIG. 10 shows a memory array that includes four of the memory cells of FIG. 6 arranged in two rows and two columns, according to one embodiment.

FIG. 10 shows a memory array 450 that includes four of the memory cells 300 arranged in two rows and two columns, according to one embodiment. Accordingly, cell 420 and 430 form one row of memory and have their WL and CG lines connected to WL1 and CG1 respectively. Likewise, cell 400 and 410 form another row of memory and have their WL and CG line connected to WL0 and CG0 respectively. Cell 400 and 420 form a column with their common and bit line connected to COM0 and BL0 respectively. Likewise, cell 410 and 430 form another column with their common and bit line connected to COM1 and BL1 respectively.

The memory array 450 is fabricated in a p-type substrate. The deep N-well of the memory cells are merged together to form one single deep N-well 304. The P-well and N-well of the memory cells in a memory row are respectively merged together. Thus each memory row contains one N-well (e.g., NW 452A, NW 452B) and one P-well (e.g., PW 453A, PW 453B). The N-well is connected to the deep N-well which in turn connects to signal DNW 454. The P-well of a memory row "m" is connected to the CGm where "m" designates the row number. By merging the wells in a row together, the memory cells in an array can be more tightly packed as most of the well-to-well spaces are eliminated. The memory array is fabricated in the same substrate as other on-chip logic circuits that require the substrate to be connected to ground or 0 v.

FIG. 11 shows the biasing voltages of the signals connecting to the memory array during different operations, according to one embodiment. Each of the memory cells in array 450 can be independently erased or programmed. Consequently memory array 450 can be used to form a large electrically erasable programmable memory (EEPROM). The cells in array 450 can also be erased or programmed together and thus memory array can also be used to form a FLASH memory.

In an embodiment, a memory cell of array 450 may be designated to be programmed. During programming, electrons are added to the floating gate of the selected cell, causing the threshold voltage of the read-out transistor to decrease, making it easier to turn on, and causing the readout current to increase during read operations. During programming, DNW is driven to 2.5 v to ensure that all the junctions in the array are reversely biased.

Assuming memory cell 400 of array 450 is selected, memory cell 400 is programmed by driving CG0 to 2 v; WL0 to 0 v; BL0 to 2.5 v; and COM0 to −2 v. The floating gate in memory cell 400 is coupled by NMOS capacitor 401. The access transistor 403 is turned on, connecting BL0 to the drain of the read out transistor 402.

As a result, a voltage of 4.5 v is imposed between the source and drain of the read out transistor 402, causing a high lateral field across the channel (e.g., the channel 313 of FIG. 8). Consequently, holes accelerate across the channel region and cause impact ionization to occur at the drain depletion region. Hot electrons generated by impact ionization are attracted by the positively biased control gate and injected into the floating gate. The negative drain bias (−2.5 v) attracts most of the hot holes and allows few holes to tunnel to the floating gate. Consequently, the number of electrons in the floating gate increases during programming.

Memory cell 410 also receives a CG and WL voltage of 2 v and 0 v, respectively. The access transistor 413 is turned on, connecting the 1.2 v bit line voltage to the drain of the readout transistor 412. The lateral field in the channel of the readout transistor 412 is insignificant as the source and drain receive substantially the same voltage. Therefore, few hot carriers are generated, and program disturbance on cell 410 is insignificant. In cell 420 and 430, with WL1 driven to 2.5 v, the access transistors 423 and 433 are turned off, disconnecting the bit lines from the readout transistors 422 and 433 in the cells and minimizing the lateral field in their channels. Consequently, hot carrier generation in the read out transistors 422 and 433 is insignificant and the thresholds of transistors 420 and 430 are not substantially affected.

Programming disturbance in array 450 is smaller than the programming disturbance in array 250. During programming of cell 220 of array 250, when 2.5 v and −2 v are imposed on the source and drain of the readout transistor, a strong lateral field is imposed across the channel of the transistor. The strong lateral field is imposed even though the transistor is turned off by a high coupling gate voltage of 3.3 v, and the number of free carriers in the channel region is small. Free carriers may still get accelerated by the high lateral field and cause impact ionizations. In array 450, impact ionizations caused by hot carriers do not occur, even in cell 420. This is because the bit line voltage is isolated from the readout transistor 422 by the turned-off access transistor 423, and the lateral field across the channel of the readout transistor 422 is too small to cause impact ionization. As a result, cell 420 in array 450 receives significantly less program disturbance than cell 220 in array 250.

In another embodiment, a memory cell of array 450 may be designated for erase. During an erase operation, electrons are removed from the floating gate of the selected cell, causing the threshold voltage of the read-out transistor to increase. The increased threshold voltage of the read-out transistor 402 makes it more difficult to turn on and causes its readout current during read operations to decrease.

In an embodiment, memory cell 400 may be designated to be erased. Accordingly, CG0 is driven to −5 v; WL0 is driven to 5 v; BL0 is driven to 3.3 v, and COM0 is driven to 5 v. As a result, the access transistor is turned off, disconnecting the readout transistor 403 from BL0. NMOS capacitor 401 is in strong inversion with an inversion layer formed in the bottom plate, and the floating gate is coupled to approximately −3.5 v. With the source of the readout transistor driven to 5 v, an inversion layer is also formed in the channel region of the PMOS transistor 402. With the drain of the readout isolated from BL0, the readout transistor 403 is in a trio region. The inverted channel is electrically connected to the source and drain, and receives a potential voltage of 5 v. As a result, a total potential of approximately 8.5 v is imposed on the gate and/or the tunnel oxide, causing a high field exceeding 10 MeV across the tunnel oxide. This allows most of the electrons trapped in the floating gate to acquire enough energy to tunnel to the inverted channel and to recombine with the holes. The tunneling mechanism is direct or Fowler-Nordheim tunneling.

In this embodiment, WL0 and thus the P-well which cells 400 and 410 share can be driven to a potential more negative than the substrate bias (0 v) because the P-well is isolated from the substrate by the deep N-well which is driven to 5 v during erase. Memory cell 410 also receives a word line voltage of −5 v but the source of its readout transistor 412 receives a bias of 0 v. As a result, the voltage across the gate-oxide is only 3.5 v and the resultant field is not sufficient to trigger Fowler-Nordheim tunneling, even though inversion layers are formed both in the channel of the readout transistor 412 and the NMOS capacitor 411. Thus, erase disturbance on memory cell 410 is insignificant.

In memory cell 420, the source of the readout transistor is driven to 5 v, but the word line connecting to WL1 receives a bias of 0 v. As a result, the voltage across the gate-oxide of the readout transistor is only 3.5 v, which is not enough to cause Fowler-Nordheim tunneling even though inversion layers are formed both in the channel of the readout transistor 422 and the NMOS capacitor 421. Thus, erase disturbance on memory cell 420 is insignificant.

In memory cell 430, both the word line and the source and drain of the readout transistor 432 are biased to 0 v. The field across the gate-oxide of the readout transistor 432 is thus negligible and the tunneling current in the readout transistor 432 is negligible. Erase disturbance in cell 430 is thus insubstantial.

In a read operation of array 450, the data in a row of memory cells can be read simultaneously. The PMOS readout transistor in a programmed and erased cell has a threshold voltage of approximately 0 v and −1.5 v, respectively. In an embodiment, a read operation may be performed when cell 400 is in the programmed state, cell 410 is in the erased state, and row 0 is selected for the read operation. Accordingly, the common lines (COM) are driven to 1.2 v, all the bit lines (BL) are pre-charged to 0 v, the coupling-gate lines (CG0) are driven to 0 v, and the N-wells and the DNW are driven to 1.5 v. The unselected word line is driven to 1.5 v, but the selected word line, WL0, is driven to 0 v. As a result, both the access transistor 403 and readout transistor 402 in cell 400 are turned on, pulling BL0 to 1.2 v.

In cell 410, the access transistor 413 is turned on but the readout transistor 412 in the cell stays off because the readout transistor 412 is in an erase state and has a threshold voltage that is more negative than the floating gate voltage. Thus, BL1 stays at 0 v. The high voltage in BL0 is subsequently sensed by a sense amplifier and driven to a data output signal with a state of "1." Likewise, the low state in BL1 is sensed by another amplifier and driven to another output signal with a state of "0." Note that access transistors in cells with unselected rows are turned off, disconnecting the cells from the bit lines.

Figure 12:
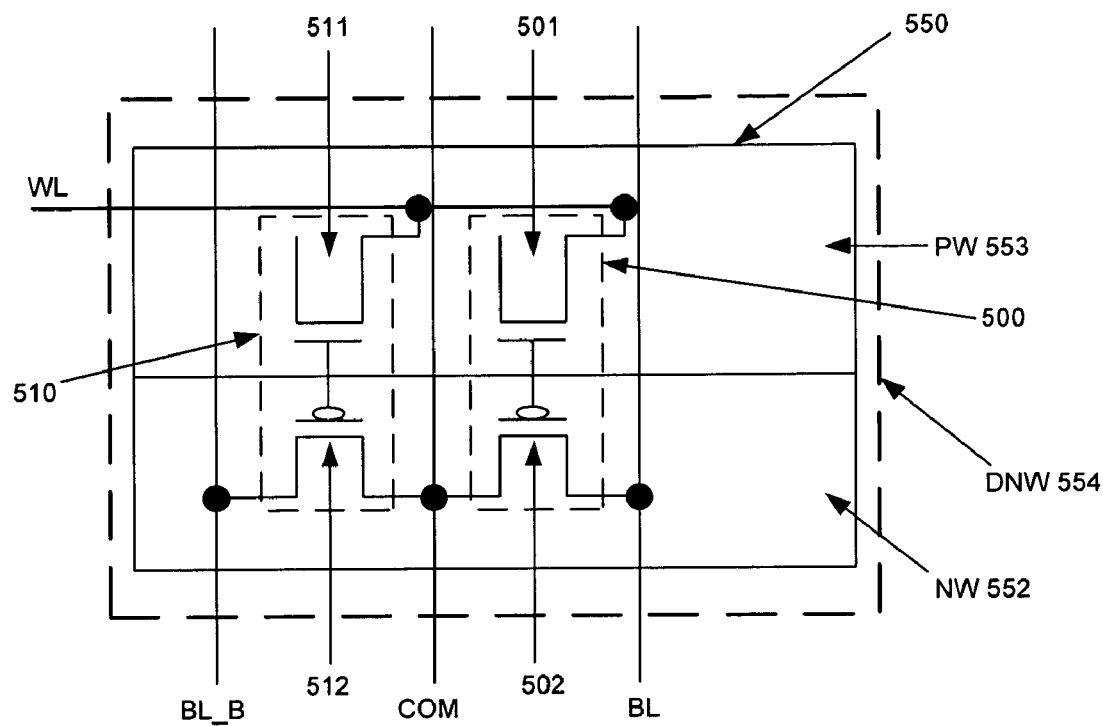
FIG. 12 illustrates two memory cells combined to form a differential cell, according to one embodiment.

Many different variations of the memory cell are possible and will be apparent to one of ordinary skill to the art. For example, two of the memory cells (e.g., the memory cell 100 of FIG. 1) can be combined as shown in FIG. 12 to form a differential cell 550 to increase the operational margin of the cell.

Differential cell 550, which includes memory cell 500 and 510, is fabricated in a p-type silicon substrate that electrically isolates the memory cell devices from the substrate. A deep N-well 554 is disposed in the P substrate. An N-well 552 and a P-well 553 are disposed next to each other in deep N-well 554. PMOS transistors 502 and 512 are disposed in N-well 552, and NMOS capacitors 501 and 511 are disposed in P-well 553.

The two halves of the cell 550 share one COM signal and one word line (WL) signal, but the two readout transistors 512 and 502 are connected to complementary bit line signals BL and BL_b. When storing data (e.g., "1") in the cell, one readout transistor (e.g., readout transistor 502) can be put in the program state, and the other readout transistor (e.g., readout transistor 512), can be put in the erase state. When storing the opposite data (e.g., "0"), read out transistor 502 can be put in the erased state and read out transistor 512 can be put in the programmed state.

During a read operation, both bit lines can be pre-charged to 0 v, and both read out transistors can be turned on with a large COM to WL voltage. For example, COM and WL can be driven to 3.3 v and 0 v respectively. Even though both transistors (e.g., read out transistor 502 and read out transistor 512) are turned on and charging both bit lines to 3.3 v, voltage in the bit line that connects to the programmed readout transistor increases much faster. Sensing can be carried out by sensing the difference in the bit line voltages when voltages in both bit lines are still increasing. In this scheme, data is represented in the cell by the difference in the threshold of the two readout transistors and not on the absolute value of their threshold voltages. Therefore, cell 550 is more tolerant to program and erase variations. Read operation speed of cell 550 is faster than the single-ended cell because cell 550 can be biased to achieve the maximum differential current in the two readout transistors.

It will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A non-volatile memory apparatus comprised of at least one non-volatile memory cell fabricated on a P substrate, wherein each non-volatile memory cell comprises:
    a deep N-well located in the P substrate, wherein a P-well and an N-well are located in the deep N-well;
    a PMOS transistor located in the N-well, wherein the PMOS transistor includes a PMOS gate-oxide;
    an NMOS capacitor located in the P-well, wherein the NMOS capacitor includes an N+ coupling region located in the P-well, and an NMOS gate-oxide; and
    a floating gate comprised of a poly-silicon gate overlying the PMOS transistor and the NMOS capacitor.

2. The non-volatile memory apparatus of claim 1, wherein the non-volatile memory system is configured to add negative charge to the floating gate using channel hot electron tunneling.

3. The non-volatile memory apparatus of claim 2, wherein the non-volatile memory system is configured to remove negative charge from the floating gate using Fowler-Nordheim tunneling.

4. The non-volatile memory apparatus of claim 1, wherein the non-volatile memory system is configured to be formed using a single-poly process.

5. The non-volatile memory apparatus of claim 1, further comprising a control gate, wherein the control gate is comprised of a channel region of the NMOS capacitor.

6. The non-volatile memory apparatus of claim 1, further comprising a tunnel oxide located in the PMOS gate-oxide overlying a channel area of the PMOS transistor, wherein the tunnel oxide is configured to allow electrons to tunnel between the floating gate and a PMOS channel during program and erase operations.

7. The non-volatile memory apparatus of claim 1, wherein the NMOS capacitance is larger than a PMOS gate capacitance.

8. The non-volatile memory apparatus of claim 1, wherein the memory cell further comprises a second PMOS transistor located in the N-well.

9. The non-volatile memory apparatus of claim 8, wherein a drain of the PMOS transistor is coupled to a source of the second PMOS transistor.

10. The non-volatile memory apparatus of claim 8, wherein the second PMOS transistor is configured to minimize a program disturbance or read disturbance of the memory system.

11. The non-volatile memory apparatus of claim 1, wherein the non-volatile cells are arranged in a plurality of rows and columns, wherein
    the NMOS capacitors of the memory cells are located in a merged P-well,
    the PMOS transistors of the memory cells are located in a merged N-well, and
    the memory cells are located in a merged deep N-well.

12. The non-volatile memory system of claim 11, further comprising:
    a bit line connected to a drain of each PMOS transistor of a column of non-volatile memory cells,
    a common line connected a source of each PMOS transistor of a column of non-volatile memory cells,
    a word line connected to the N+ coupling region of each NMOS capacitor of a row of non-volatile memory cells.

13. The non-volatile memory system of claim 12, wherein each of the non-volatile memory cells of the array is configured to be independently programmed and erased.

14. The non-volatile memory system of claim 9, wherein the non-volatile cells are arranged a plurality of rows and columns, wherein
    NMOS capacitors of the memory cells are located in a P-well;
    PMOS transistors of the memory cells are located in an N-well; and
    the memory cells are located in a deep N-well.

15. The non-volatile memory system of claim 14, wherein each of the non-volatile memory cells of the array is configured to be independently programmed and erased.

16. A method of fabricating a non-volatile memory apparatus including at least one non-volatile memory cell on a P substrate, wherein the method of forming each non-volatile memory cell comprises:
    forming a deep N-well in the P substrate, wherein a P-well and an N-well are located in the deep N-well;
    placing a PMOS transistor in the N-well, wherein the PMOS transistor includes a PMOS gate-oxide;
    forming an NMOS capacitor in the P-well, wherein the NMOS capacitor includes an N+ coupling region located in the P-well, and an NMOS gate-oxide; and
    placing a floating gate comprised of a poly-silicon over the channel region of the PMOS transistor and the NMOS capacitor.

17. The method of claim 16, further comprising configuring the non-volatile memory apparatus to add negative charge to the floating gate using channel hot electron tunneling.

18. A method, comprising:
    adding negative charge to a floating gate of a non-volatile memory cell using channel hot electron tunneling, wherein the memory cell is fabricated on a P substrate and comprises a deep N-well located in the P substrate, wherein a P-well and an N-well are located in the deep N-well, a PMOS transistor located in the N-well, wherein the PMOS transistor includes a PMOS gate-oxide, an NMOS capacitor located in the P-well, wherein the NMOS capacitor includes an N+ coupling region located in the P-well, and an NMOS gate-oxide, and a floating gate comprised of a poly-silicon gate overlying the PMOS transistor and the NMOS capacitor; and removing negative charge from the floating gate using Fowler-Nordheim tunneling.

19. The method of claim 18, wherein the tunneling oxide for both adding and removing negative charge from the floating gate of the non-volatile memory cell is the gate oxide over the PMOS channel region.

20. The method of claim 19, further comprising isolating the PMOS transistor using an additional PMOS transistor to minimize a program disturb problem, wherein the additional PMOS transistor is located next to the first PMOS transistor.

* * * * *